(12) United States Patent
Giovannini et al.

(10) Patent No.: US 10,320,591 B2
(45) Date of Patent: Jun. 11, 2019

(54) BURST-TOLERANT DECISION FEEDBACK EQUALIZATION

(71) Applicant: Rambus Inc., Sunnyvale, CA (US)

(72) Inventors: Thomas J. Giovannini, San Jose, CA (US); Abhijit Abhyankar, Sunnyvale, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/570,703

(22) PCT Filed: Jul. 22, 2016

(86) PCT No.: PCT/US2016/043534
§ 371 (c)(1),
(2) Date: Oct. 30, 2017

(87) PCT Pub. No.: WO2017/019495
PCT Pub. Date: Feb. 2, 2017

(65) Prior Publication Data
US 2018/0294999 A1    Oct. 11, 2018

Related U.S. Application Data

(60) Provisional application No. 62/304,834, filed on Mar. 7, 2016, provisional application No. 62/197,799, filed on Jul. 28, 2015.

(51) Int. Cl.
*G06F 3/06* (2006.01)
*H04L 25/03* (2006.01)
*G11C 19/00* (2006.01)

(52) U.S. Cl.
CPC ...... *H04L 25/03057* (2013.01); *G06F 3/0604* (2013.01); *G06F 3/0644* (2013.01);
(Continued)

(58) Field of Classification Search
CPC ............. H04L 25/03057; G06F 3/0644; G06F 3/0673; G06F 3/0604; G11C 19/00
See application file for complete search history.

(56) References Cited

U.S. PATENT DOCUMENTS 6,061,395 A    5/2000  Tonami
6,501,695 B1 * 12/2002  Brown ..................... G11C 7/12
                                                              365/203

(Continued)

OTHER PUBLICATIONS

Notification of Transmittal of the International Search Report and the Written Opinion of the International Searching Authority dated Oct. 7, 2016 re: Int'l Appln. No. PCT/US16/043534. 14 Pages.

*Primary Examiner* — Francisco A Grullon
(74) *Attorney, Agent, or Firm* — Charles Shemwell

(57) ABSTRACT

A first sequence of data bits is shifted into storage elements of a signal receiver during a first sequence of bit-time intervals, and a memory access command indicates that a second sequence of data bits is to be received within the signal receiver during a second sequence of bit-time intervals. Contents of the shift-register storage elements are conditionally overwritten with a predetermined set of seed bits, depending on whether one or more bit-time intervals will transpire between the first and second sequences of bit-time intervals. Equalization signals generated based, at least in part, on contents of the shift-register storage elements are used to adjust respective signal levels representative of one or more bits of the second sequence of data bits.

23 Claims, 6 Drawing Sheets

(52) U.S. Cl.
CPC ............ *G06F 3/0673* (2013.01); *G11C 19/00* (2013.01); *H04L 25/03146* (2013.01); *H04L 25/03878* (2013.01)

(56) References Cited

U.S. PATENT DOCUMENTS

| | | | |
|---|---|---|---|
| 7,233,164 B2* | 6/2007 | Stojanovic | H04L 25/028 326/22 |
| 7,346,819 B2* | 3/2008 | Bansal | G01R 31/31716 714/716 |
| 7,388,910 B2 | 6/2008 | McKown | |
| 8,023,584 B2* | 9/2011 | Zerbe | H04L 25/03038 375/285 |
| 8,069,378 B2* | 11/2011 | Zerbe | G01R 31/31703 714/715 |
| 8,654,829 B2* | 2/2014 | Zerbe | H04L 25/03038 375/229 |
| 8,861,667 B1 | 10/2014 | Zerbe et al. | |
| 9,148,187 B2 | 9/2015 | Bucher et al. | |
| 9,191,253 B2* | 11/2015 | Yomo | G06F 17/142 |
| 9,412,428 B2* | 8/2016 | Giovannini | G11C 7/222 |
| 9,824,730 B2* | 11/2017 | Giovannini | G11C 7/222 |
| 2004/0022311 A1* | 2/2004 | Zerbe | H04L 25/03038 375/229 |
| 2004/0054482 A1 | 3/2004 | Poechmueller | |
| 2009/0185612 A1 | 7/2009 | McKown | |
| 2010/0195712 A1* | 8/2010 | Yu | H03M 13/2707 375/240.01 |
| 2012/0140812 A1 | 6/2012 | Ho et al. | |
| 2013/0128944 A1* | 5/2013 | Zerbe | H04L 25/03038 375/232 |
| 2013/0346721 A1* | 12/2013 | Giovannini | G11C 7/222 711/167 |
| 2014/0286383 A1* | 9/2014 | Zerbe | H04L 25/03038 375/230 |

* cited by examiner

FIG. 3 Burst DFE Receiver 170

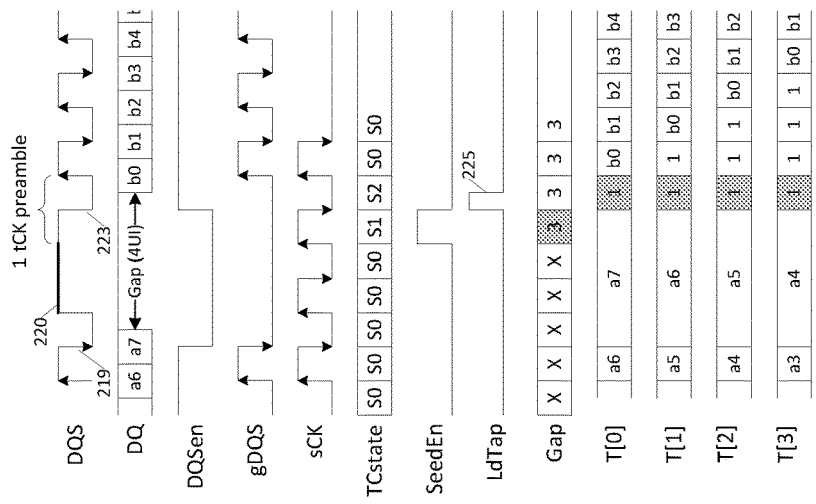
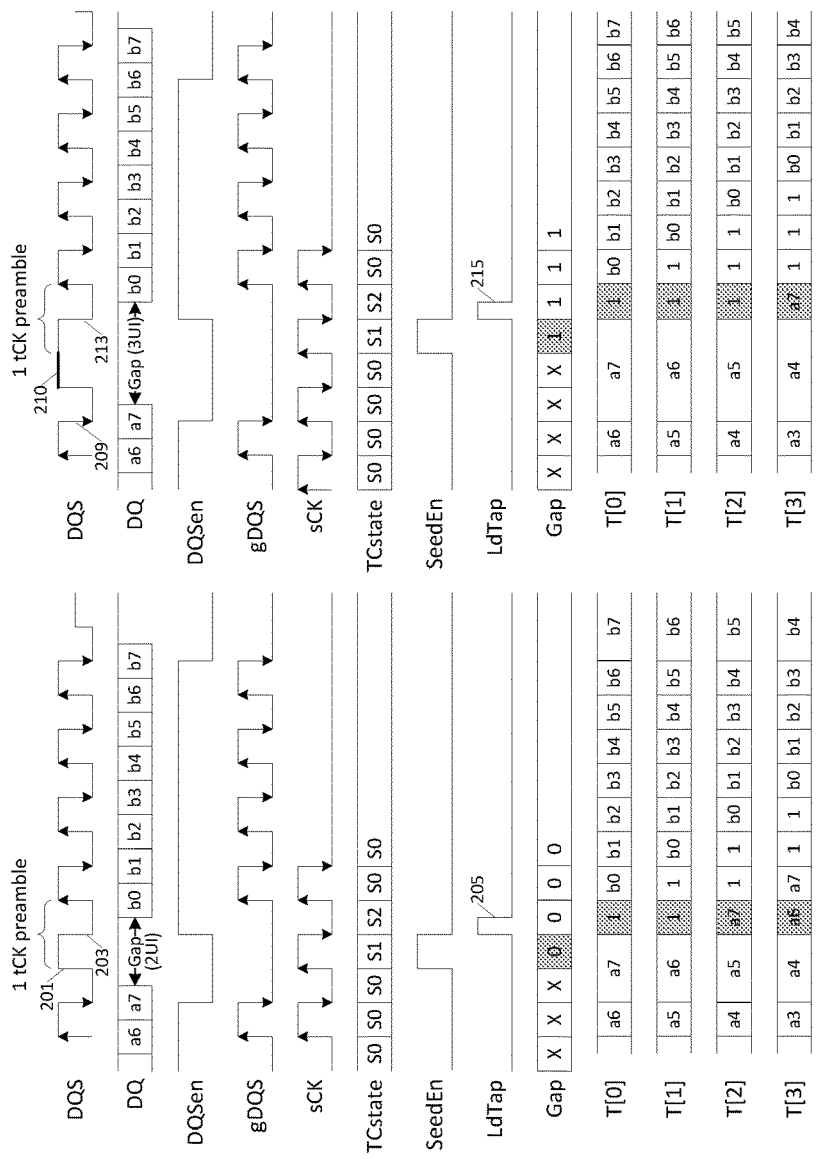
FIG. 4  FIG. 5  FIG. 6

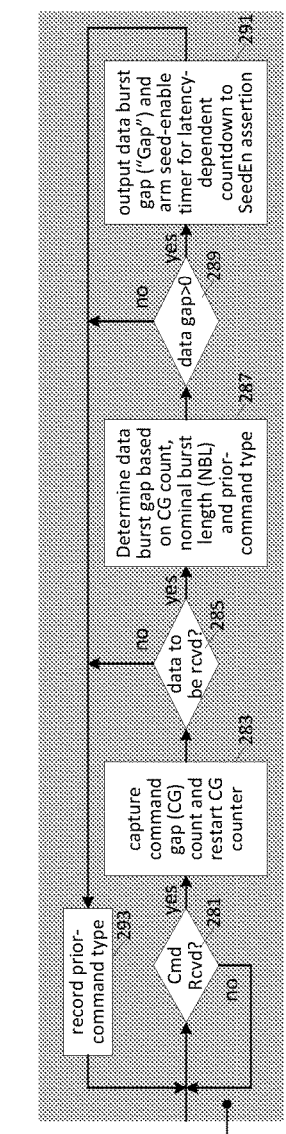
FIG. 7
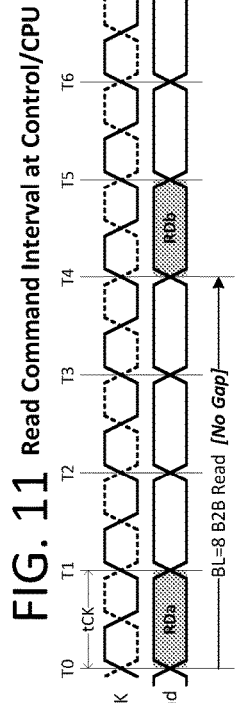
FIG. 11 Read Command Interval at Control/CPU
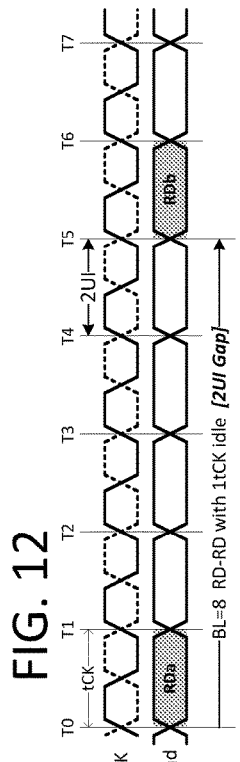
FIG. 12
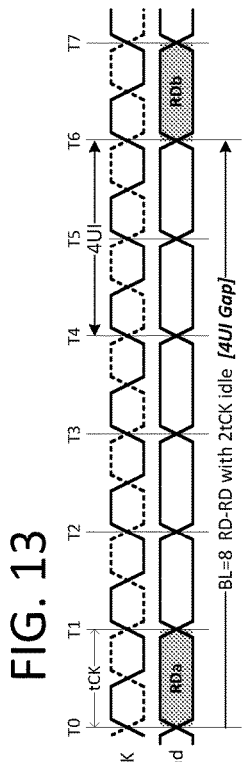
FIG. 13
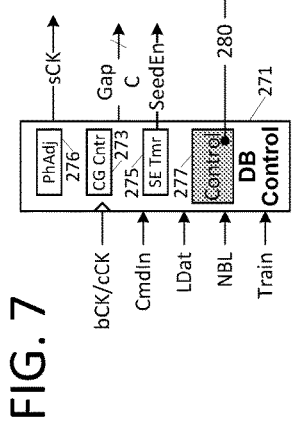
FIG. 8 Write Command Interval at DB/Mem
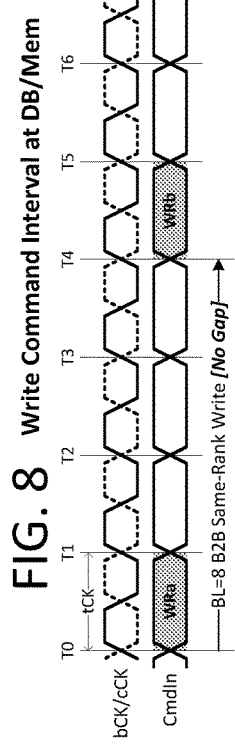
FIG. 9 Write Command Interval at DB/Mem
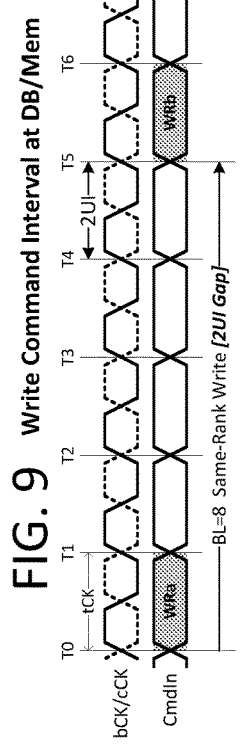
FIG. 10 Write Command Interval at DB/Mem
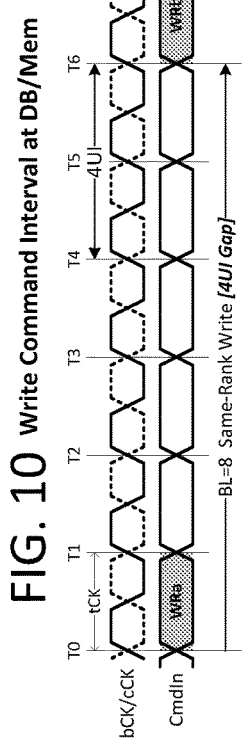

BURST-TOLERANT DECISION FEEDBACK EQUALIZATION

CROSS-REFERENCE TO RELATED APPLICATIONS

This application hereby claims priority to and incorporates by reference each of the following U.S. Provisional Patent Applications: Application No. 62/197,799 filed Jul. 28, 2015 and titled "Burst-Mode Receive Decision Feedback Equalization for Memory Systems"; and Application No. 62/304,834 filed Mar. 7, 2016 and titled "Burst-Tolerant Decision Feedback Equalization."

TECHNICAL FIELD

The present disclosure relates to equalization of signals conveyed between integrated circuit devices.

BACKGROUND

Decision feedback equalizers ("DFEs") are often used in high speed chip-to-chip signaling systems to estimate signaling-channel response to previously transmitted symbols and feed the estimated response back to digital "decision" circuitry, generally in the form of an adjusted signal level. The digital decision circuitry, in turn, resolves the DFE-adjusted signal level into a digital sample.

Despite enabling increased signaling margin (and thus lower bit error rates (BER) and/or faster signaling rates, DFEs generally require an uninterrupted symbol transmission stream to yield the channel-response estimation and thus find limited application in bursty signaling systems.

DRAWINGS

The various embodiments disclosed herein are illustrated by way of example, and not by way of limitation, in the figures of the accompanying drawings and in which like reference numerals refer to similar elements and in which.

Figure 3:
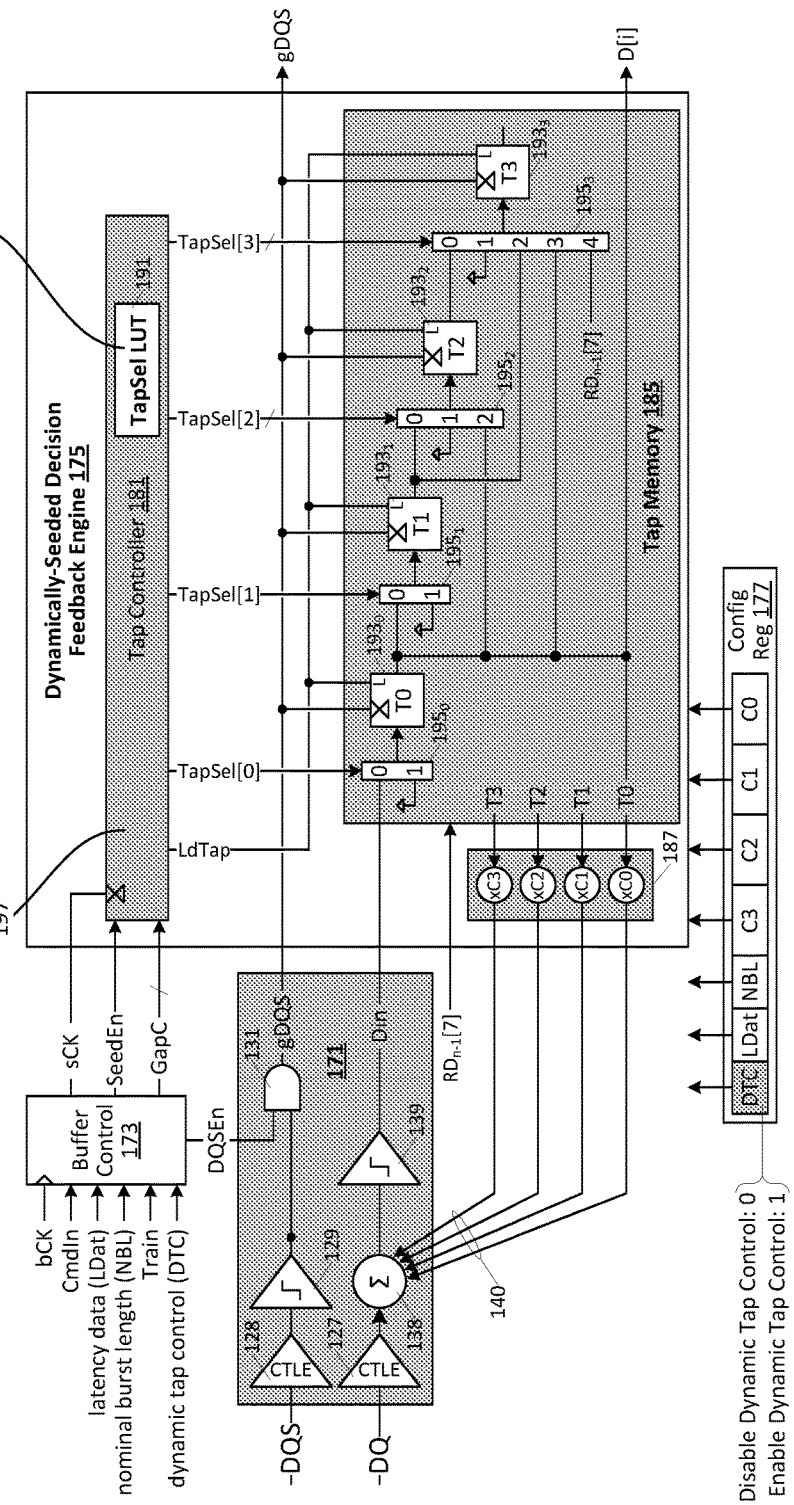
FIG. 3 illustrates an embodiment of a four-tap burst DFE receiver that may be deployed within the memory components and data buffer ICs of FIG. 1 to provide dynamically seeded decision feedback and thus gap-tolerant DFE operation.
Figure 14:
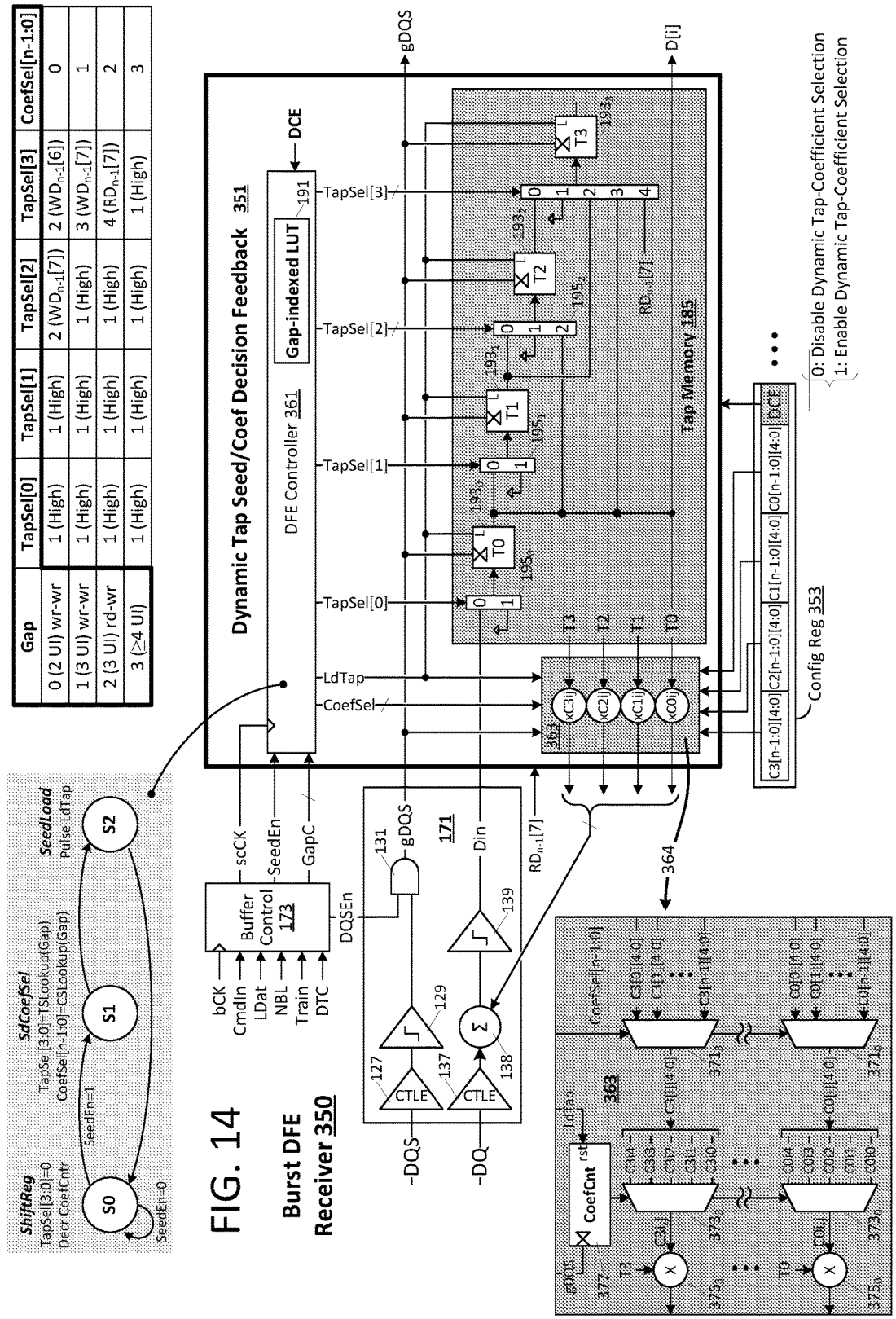
Figures 15, 16, 17:
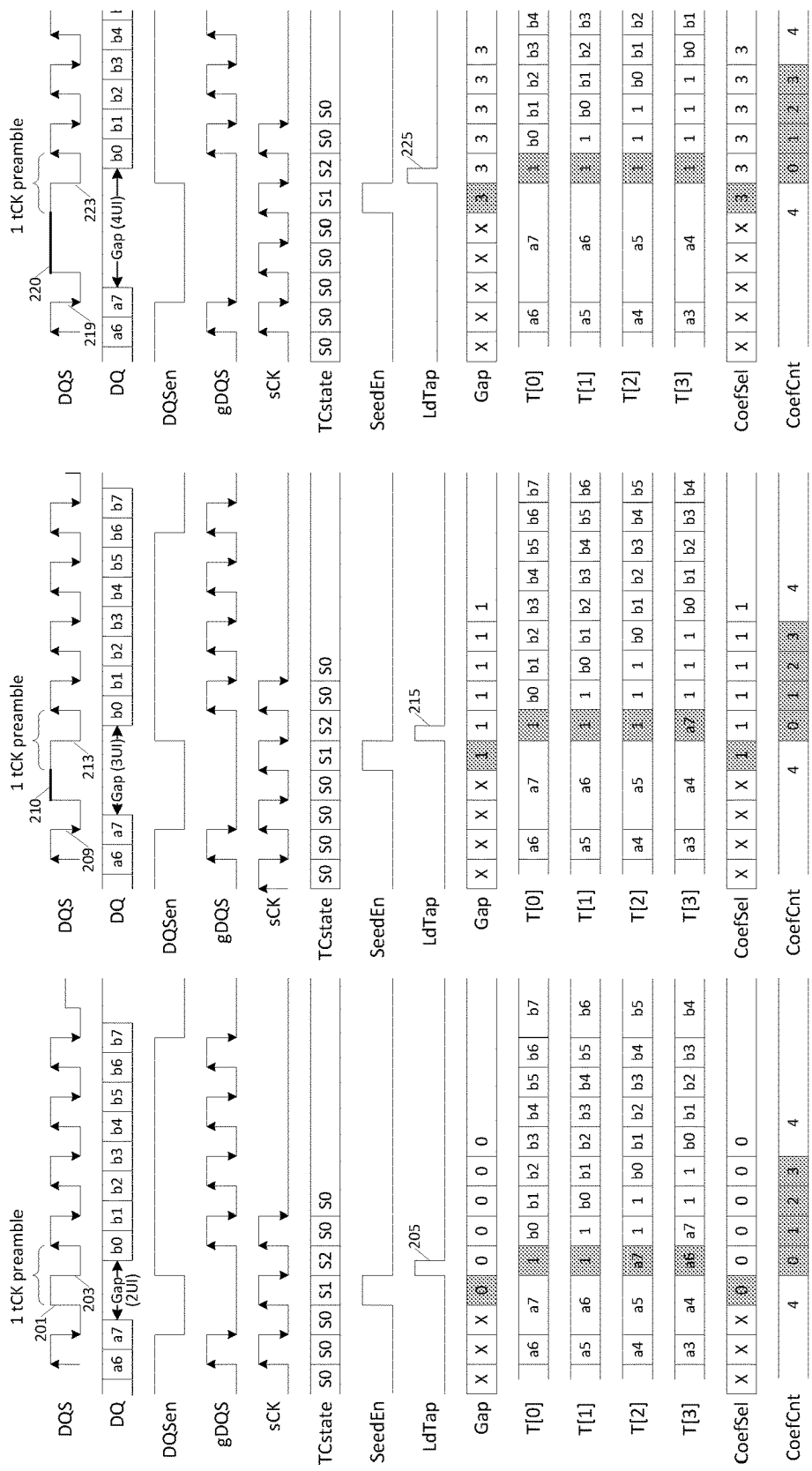

FIGS. 4, 5 and 6 are timing diagrams illustrating exemplary 2-UI, 3-UI and 4-UI write-after-write tap memory seeding operations within the burst-mode DFE receiver of FIG. 3;

FIG. 7 illustrates an embodiment of a seed control circuit that may be implemented within a memory die, data buffer chip or control component to carry out the seed control functions discussed above in reference to FIG. 3;

FIGS. 8, 9 and 10 illustrate exemplary gap-value determinations within a memory die or data buffer IC having the seed controller of FIG. 7 and in the context of successive write operations directed to the same memory rank with predetermined write burst lengths;

FIGS. 11, 12 and 13 illustrate exemplary gap-value determinations within a control component having the seed controller of FIG. 7 and in the context of successive read operations directed to the same memory rank with predetermined read burst lengths;

FIG. 14 illustrates an alternate embodiment of a burst DFE receiver that may be deployed within the signaling interface of a control component, memory die or data buffer chip; and FIGS. 15, 16 and 17 illustrate exemplary 2-UI, 3-UI and 4-UI write-after-write tap memory seeding and coefficient selection operations within the burst-mode DFE receiver of FIG. 14;

DETAILED DESCRIPTION

In various embodiments disclosed herein, gaps between burst transmissions are detected and measured to enable dynamic seeding of a decision feedback equalizer (DFE), thereby achieving DFE-improved signaling performance (e.g., increased margin, reduced bit error rate (BER) and/or higher signaling frequencies) despite bursty transmission profiles. In a number of embodiments discussed below, such "burst-tolerant" or "burst-mode" decision feedback equalization is deployed on one or both sides of a bidirectional data signaling interface of a memory system or memory subsystem, though the techniques, circuitry and principles disclosed may be extended to any signaling system or context that may benefit from decision feedback equalization in the presence of bursty traffic.

Figure 1:
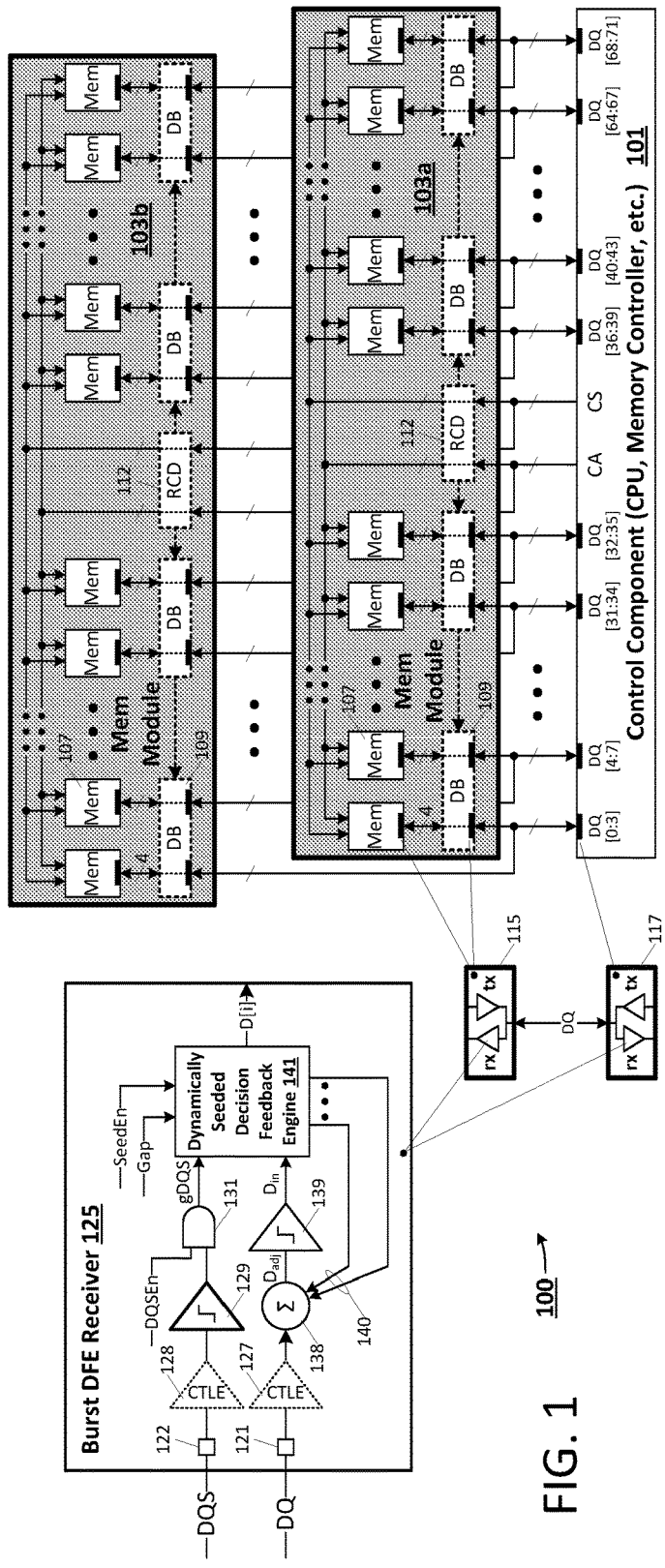
FIG. 1 illustrates an exemplary memory system that employs burst-mode DFE receivers according to various embodiments described herein.

FIG. 1 illustrates an exemplary memory system 100 that employs burst-mode DFE receivers according to various embodiments described herein. In the implementation shown, memory system 100 includes a control component 101 and one or more memory modules 103a, 103b—socketed substrates having memory components 107 ("Mem") thereon—interconnected another via data (DQ), command/address (CA) and chip-select (CS) signaling links. Though not specifically depicted, various other signaling links may also be implemented, including data strobe signaling links to convey data strobe signals for timing (synchronizing) data reception within control component 101 and memory components 107, a clock signal link to convey a clock signal that enables synchronous command/address signal reception within the memory components, on-die termination signals to dynamically enable/disable application of termination structures to the various signaling links, and so forth.

In the embodiment of FIG. 1, each of the memory modules 103a, 103b (which are coupled in parallel to the data, command/address, chip-select and other signal lines extending from control component 101) is a dual inline memory module (DIMM) having a respective row of eighteen memory components 107 disposed on each side of the memory-module substrate (shaded). Each of the memory components 107 in turn includes one or more memory dies, for example, stacked within a multi-die integrated-circuit (IC) package where there are two or more memory dies per package. Further, each set of eighteen memory dies on a given side of the module substrate and at a particular level within a memory component die stack may be managed as a unit, referred to herein as a memory rank. For example, all memory dies within the same rank may be coupled to a shared chip-select line and/or have a shared logical identifier that selects that rank for memory access operations by enabling the constituent memory dies of the rank to sample an incoming memory access command at the same clock timing edge. More specifically, in the memory-module embodiment shown (and ignoring the optional registered clock driver 112 (RCD) and data buffer components 109 (DB) for the moment), each memory die of a given rank is (i) coupled to a shared one of the multiple chip-select lines routed between the host memory module (generically, 103) and control component 101, (ii) coupled in common with all the other memory components 107 to the command/address links ("CA"), and (iii) coupled to a respective 4-bit slice (or "lane") of the 72 data signaling lines routed between the control component and memory module. By this arrangement, when the chip-select signal dedicated to a particular memory rank is asserted, the constituent memory dies of the selected rank exclusively sample the command/address path (e.g., at one or more deterministically selected clock edges) to capture a rank-directed command/address and then respond to the command/address a predetermined time later by outputting a 72-bit read data word (each memory die contributing a respective set of four bits) or sampling an incoming 72-bit write data word (each memory die receiving/sampling a respective set of four bits) via the 18 four-bit data lanes.

Still referring to FIG. 1, registered clock driver 112 and data buffer components 109 are optional components (as indicated by their dashed outline) provided to facilitate higher memory rank counts than control-control component driver loading/fan-out constraints may otherwise permit. In one embodiment, for example, registered clock driver 112 routes incoming commands to a CS-selected subset of on-module command/address lines (e.g., one such set of CA lines for the row of memory components on either side of the memory module, or even more compartmentalized subsets as necessary to meet fan-out, loading or other practical constraints) and also delivers command and timing information to data buffer components 109 to enable write data reception and read data transmission operations indicated by the incoming command stream. Data buffer components 109 (also referred to herein as data buffer integrated circuits (ICs) or buffer chips), forward write data received via data lines (DQ) to a target rank of memory dies (e.g., memory rank enabled by RCD-forwarded chip-select (CS) signal) and, conversely, forward read data from a selected memory rank onto the DQ lines and thus back to control component 101. As such, each of the data buffer components 109 includes a control-side data interface to exchange read and write data with control component 101 via the DQ lines (which include on-module and off-module segments), a memory-side data interface to exchange read and write data with a chip-selected set of memory dies, and a command port to receive command and timing signals (e.g., clock-enable, clock signal, etc.), commands and configuration information from registered clock driver 112. In the particular example shown, each data buffer 109 includes two 4-bit wide control-side data interfaces, so that a total of nine data buffers are provided to transmit and receive data via the eighteen 4-bit control-side data lanes. Further, in one embodiment each data buffer component 109 exchanges data with a respective pair of memory components 107 on each side of the memory module and thus with the memory die pair of any one of N memory ranks, where N is twice the memory die count per memory component 107. Various other organizations/quantities of memory modules, memory components, memory dies, data path widths, command path widths, signal routing topologies, data buffer components and/or RCD components may be employed in alternative embodiments, including components in which memory modules or entire memory subsystems (control component and memory dies, at least) are implemented as a system-in-package, system-on-chip, package-in-package, etc. Also, each of the constituent memory dies of a given memory rank generally includes a core storage array (i.e., a volatile or non-volatile core storage array, such as a DRAM (dynamic random access memory) array, SRAM (static random access memory) array, flash memory array, etc.) together with a data interface, and command interface in accordance with the host memory system architecture, as well as internal control circuitry to manage the storage and retrieval of write data and read data, respectively, with respect to the core storage array.

While burst-mode receive DFE ("BRxDFE") circuitry may be implemented on either or both sides of a given chip-to-chip signaling link shown in FIG. 1, the examples below focus on read data reception within control component 101 and write data reception within the data buffer components 109 and memory dies 107—that is, within the receivers "rx" of the generalized data (DQ) transceiver elements shown at 115 and 117. Accordingly, continuing with the data-strobed modular-memory system context described thus far, each such Burst DFE receiver may be implemented generally as shown in detail view 125. That is, external DQ (data) and DQS (data strobe) lines are coupled to respective pads 121, 122 or other interconnects of the host integrated circuit (IC) die (i.e., control component, data buffer IC and/or memory die) which are, in turn, connected to respective signal conditioning circuits 127, 128 (e.g., continuous-time linear equalizer circuits, CTLE). After signal conditioning (i.e., at the CTLE output), the data strobe signal (DQS) is supplied to a strobe digitizer or "slicer" 129 that resolves the incoming signal amplitude to a logic level output ('1' or '0'), effectively deciding the digital state of the transmitted signal, an operation referred to herein as the digital decision. A strobe-enable signal (DQSen), generated in response to an incoming write command (e.g., delayed by a number of bit-time intervals and an additional clock-to-strobe phase delay as discussed below) and asserted at the conclusion of a strobe preamble waveform, enables the output of strobe slicer 129 to propagate through logic gate 131 to downstream logic (i.e., as gated strobe signal gDQS), in effect opening a window for strobe-synchronized data reception within the host integrated circuit device.

The data signal follows a similar route to a data slicer 139, but is first adjusted in response to decision feedback signals 140 from a dynamically seeded decision feedback engine 141 to yield a feedback-equalized data signal level, $D_{adj}$. In the embodiment shown and examples below, decision feedback signals 140 are summed with the incoming data signal (e.g., within summing circuit 138), though various other techniques for applying the decision feedback to the incoming data signal may be employed in all cases. Like strobe slicer 129, data slicer 139 resolves the incoming signal into a logic level output, in this case resolving the digital state of the equalized data signal level and thus recovering the originally transmitted data symbol as input data signal, $D_{in}$.

Still referring to FIG. 1, the gated strobe signal (gDQS) from logic gate 131 and the recovered data symbol ($D_{in}$) from data slicer 139 are supplied to dynamically-seeded decision feedback engine 141 ("feedback engine" for brevity) which manipulates the state of the decision feedback 140 signals in accordance with incoming gap and seed-enable signals ("Gap" and "SeedEn"). More specifically, as explained in greater detail below, feedback engine 141 responds to assertion of the seed-enable signal by pre-setting ("seeding") an internal "tap memory" that stores the instantaneous decision feedback state (and thus sources the decision feedback signals 140) to predetermined values in accordance with the duration of a burst-to-burst data gap indicated by the gap value, in effect deselecting a shift-register data progression applied during continuous data reception in favor of seed data sources that estimate the gap-induced channel state. In other embodiments, feedback engine 141 may also select an array of equalization coefficients— weights or scaling values to be applied to tap memory values—in accordance with the burst-to-burst data gap and sequence through the coefficient array as the post-gap data burst is received.

Figure 2:
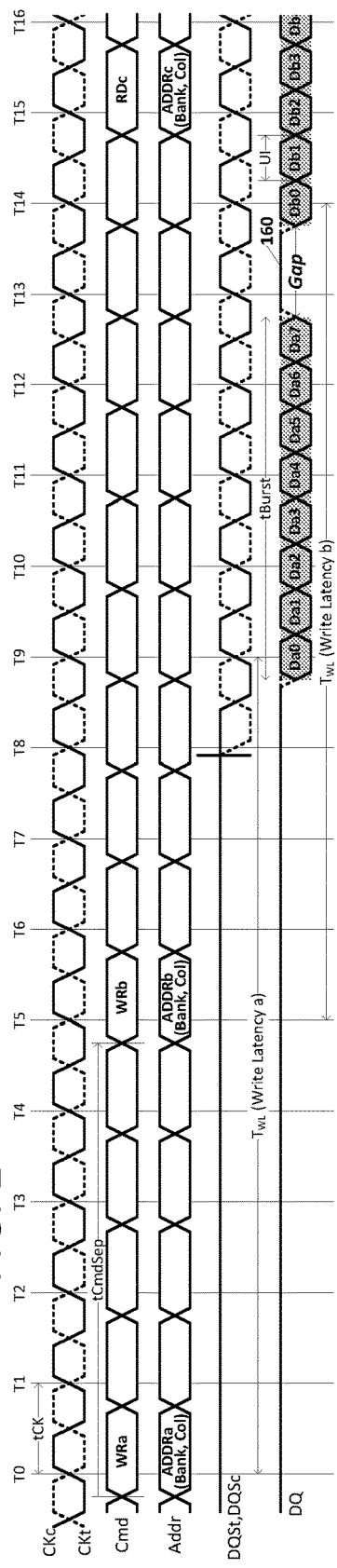
FIG. 2 is a timing diagram illustrating an exemplary sequence of data-write transactions within the memory system of FIG. 1 from the perspective of a memory die or data buffer chip.

FIG. 2 is a timing diagram illustrating an exemplary sequence of same-rank data-write transactions within the memory system of FIG. 1 from the perspective of a memory die or same-module data-write transactions from the perspective of a data buffer IC. As shown, write commands, WRa and WRb, and corresponding address values, ADDRa and ADDRb, respectively, are sampled/received synchronously with respect to a system clock signal (e.g., on the falling edge of the 'true' component "CKt" of a differential clock signal having true (CKt) and complement (CKc) signal components). Associated 8-bit write data bursts Da[7:0] and Db[7:0] are each received via data lines DQ a predetermined time (write latency interval, $T_{wL}$) after receipt of their respective command/address values, in response to rising and falling edges of a differential data strobe signal, DQS (including true and complement signal components, DQSt, DQSc). As a matter of terminology, the system clock period is referred to herein as a tCK, and the ideal data valid interval (or ideal data eye width) is referred to as a unit interval (UI). In the example shown, there are two unit intervals per tCK interval due to the double-data-rate (DDR) data signaling scheme, though the individual data intervals may be (and are depicted as being) phase offset from system clock cycles within the different memory components and data buffers due to the mesochronous relationship between the data strobe and system clock signals (i.e., same frequency, arbitrary phase offset).

Still referring to FIG. 2, it can be seen that each eight-bit data burst length transpires over a four tCK period, tBurst, meaning that peak (continuous) data throughput with respect to a given memory die or data buffer IC occurs when write commands are received at 4tCK intervals (i.e., commands are separated by tBurst). In a number of embodiments, data burst length (BL) and thus tBurst may be directly and/or indirectly programmable and the corresponding command separation may scale accordingly. For example, burst length (BL) may be programmed to a specific one of system-supported values (4-bits, 8-bits, etc.) and/or one or more programmably enabled features may effect extension of an otherwise fixed, programmed or commanded burst length (e.g., enabling error-checking information to be appended to each data burst, extending the burst length, for example, from 8 bits to 10 bits). Also, individual commands may specify that the corresponding data burst is to be truncated relative to the otherwise fixed-by-design or programmably-configured burst length (e.g., burst-chop command indicating a 4-bit data burst despite an 8-bit burst-length setting) which may or may not permit a correspondingly truncated command separation. For example, where prefetch operations within the memory device or other practical considerations mandate a predetermined same-rank command separation (e.g., according to programmed burst length) regardless of whether a given command specifies a truncated burst, any such truncated data burst may yield an increased data gap (i.e., due to command-truncated tBurst) that may be accounted for by the burst DFE receiver.

The many-to-one relationship between memory modules and the control component in the exemplary system of FIG. 1 presents another variable in the burst gap determination. Absent command bus snooping/sniffing, for example, the data buffer ICs and memory dies on a given memory module lack visibility to transactions directed to another memory module, and memory dies within a given memory rank lack visibility to transactions directed to another memory rank. Accordingly, even though gaps between commands received within a data buffer or memory die may be sufficiently separated to effect a data transmission gap on the module-shared (and rank-shared) data lines, the burst DFE seeding policies described herein account for the possibility that the data transmission gap begins at the end of a data burst from/to another module or rank. Accordingly, command separation determinations herein account for scenarios where two commands directed to the same-module/same-rank are, by virtue of their respective arrival times, assumed to have been transmitted successively (i.e., without intervening command to another module/rank) as well as scenarios where the command arrival times permit possibility of intervening command transmission to another module or rank. In general, embodiments below focus on the perspective of the data buffer which, in at least one implementation, receives the command stream for each memory rank on the memory module (or at least each rank for which the data buffer forwards data traffic) and thus has visibility to all same-module memory commands. Where not explicitly stated, it should be understood that the same-module/different-module considerations bearing on gap determination within a data buffer IC may also apply to same-rank/different-rank considerations bearing on gap determination within a memory die.

Where incoming write command separation (tWrSep) exceeds tBurst, the corresponding write data bursts will be separated by a gap 160 having a duration according to the difference between those two intervals (i.e., tWrSep minus tBurst). In the particular example shown, the separation between full-burst write commands 'WRa' and 'WRb' is 5tCK, thus yielding a 2UI (or single tCK) gap between the corresponding 8-bit data bursts, Da[7:0] and Db[7:0]. As discussed with respect to embodiments below, the data buffer, memory die and/or control component may include circuitry to monitor command separation, programmed burst length and command-specified burst truncation and thereby detect and quantify gaps between data bursts, accounting for the possibility of intervening commands to a different module/rank where perceived gap timing permits. From the perspective of the dynamically seeded decision feedback equalizer within any of those components, the gaps of interest are those that precede a data reception transaction and thus a gap that precedes a write data burst in a memory die or data buffer, and a gap that precedes a read data burst within the control component (i.e., CPU, dedicated memory controller, etc.). A number of embodiments described below demonstrate dynamic seeding of decision feedback taps within a memory die or data buffer IC to compensate for nonzero gap intervals (i.e., between successive write data bursts or between a read data burst and ensuing write data burst). Operations and circuits described within the memory die and/or data buffer IC may likewise be implemented within a processor, dedicated memory controller or other control component to provide dynamic seeding of decision feedback taps for successive, non-continuous read data bursts (i.e., resulting from successive read command transmissions separated by an interval greater than tBurst) and for successive write data and read data bursts separated by a non-zero gap interval.

FIG. 3 illustrates an embodiment of a four-tap burst DFE receiver 170 that may be deployed within the data buffer ICs of FIG. 1 to provide dynamically seeded decision feedback and thus gap-tolerant DFE operation. As shown, burst DFE receiver 170 includes, as a front-end circuitry 171, continuous time linear equalizers 127, 128, summation circuit 138, slicers 129, 139 and logic gate 131, all of which operate generally as described above, as well as a buffer control circuit 173 ("buffer controller") and dynamically seeded decision feedback engine 175 ("feedback engine").

In the embodiment shown, buffer controller 173 receives incoming commands via CmdIn synchronously with respect to a buffer clock signal, bCK (e.g., an RCD-forwarded instance of the system clock described above or clock signal derived therefrom) as well as a burst-length value (BL), dynamic tap control signal (DTC), command-to-data latency information (LDat) and, during start-up and/or periodic calibration operations, training data (Train). As discussed in greater detail below, buffer controller 173 includes internal circuitry to measure or otherwise determine separation between successively received commands and, where the trailing command is a write command, apply the command separation information together with the leading command type and burst-length setting to generate a gap code (GapC) representative of the "burst gap" between the yet to be received write data burst and a prior read or write data burst, accounting for the possibility of an intervening data transmission to/from a different memory module where timing permits.

Buffer controller 173 additionally includes circuitry to ascertain the phase offset between the buffer clock and data strobe timing domains (e.g., based on the training data) and to generate a "seed" clock, accordingly—a phase-shifted version of the buffer clock aligned with the data strobe domain and referred to herein as a seed clock. As discussed below, upon determining a non-zero burst gap in connection with a prospective write data burst, buffer controller 173 outputs a seed-enable signal (SeedEn) timed in accordance with the latency data and clock-to-strobe phase offset to enable a dynamic seeding operation within feedback engine 175 during the data gap interval.

Still referring to FIG. 3, feedback engine 175 includes a tap controller 181, tap memory 185 and coefficient multipliers 187, the latter multiplying tap value outputs from tap memory 185 with programmed coefficient values (i.e., C0-C3 stored within configuration register 177) to yield decision feedback signals 140. In the embodiment shown, tap memory 185 includes four tap memory elements $193_0$-$193_3$ (T0, T1, T2, T3—collectively 193) each implemented by a 1-bit register (or latch) that synchronously latches the data at its input in response to a rising or falling edge of the gated strobe signal and that asynchronously latches the data at its input in response to a tap-load signal (LdTap) from tap controller 181. Each of the tap memory elements 193 outputs a respective stored tap memory value (referred to by the same name as the tap memory element in which the bit is stored and thus T0, T1, T2 and T3) to a respective multiplier within coefficient multiplier unit 187.

In the depicted embodiment, each of tap memory elements 193 is fed by a respective one of tap multiplexers $195_0$-$195_3$, thus enabling the tap data source to be selected from (i) the output of a prior tap memory element in a default bit-shifted tap-data progression (e.g., with the input of the second tap memory element being received from the first tap memory), or (ii) one or more seed data sources. The tap multiplexers (collectively 195) are controlled by respective tap-select signals from tap controller 181 referred to collectively herein as a tap select value, TapSel[3:0]. Individual tap select signals (TapSel[0], TapSel[1], TapSel[2], and TapSel[3]) can each consist of one or more control bits as necessary to select the individual inputs to their respective tap multiplexers. By this arrangement, tap controller 181 may set the tap select value either to enable the default tap data progression in which the data value D[i] captured within memory element T0 during a given unit interval propagates in turn through memory elements T1, T2 and T3 in subsequent unit intervals (i.e., a shift-register progression in which the tap memory is operated as a shift register having N storage elements, where N=4 in this example) or to enable the tap memory elements 193 to be parallel-loaded with respective seed data values (i.e., enable the tap memory elements to be seeded) in response to assertion of the tap-load pulse and according to the burst gap scenario signaled by buffer controller 173.

In the embodiment of FIG. 3, tap controller 181 implements a state machine timed by rising and falling edges of the seed clock and responsive to the seed-enable and gap-code signals from buffer controller 173. Referring to detail view 197, for example, while seed-enable is low, the tap controller remains in a shift-register state (S0) in which the tap select value selects a default, shift-register progression of data through tap memory elements 193 (i.e., each of the tap-select signals is set to zero to effect a bit-shifted tap data progression within tap memory 185 as discussed above). Upon sampling a logic-high seed-enable signal, tap controller 181 transitions to seed-selection state S1 and, in that state, prepares for a tap-seeding operation by setting the tap-select signals to select seed values in accordance with the gap code supplied by buffer controller 173. In the particular embodiment, shown, for example, tap controller 181 indexes a programmable lookup table 191 ("TapSel LUT"—which could alternatively be implemented by logic circuitry) using the gap code to retrieve a set of tap seed values in accordance with the data burst scenario detected by buffer controller 173. Thus, in a 2-UI gap, write-write scenario (i.e., successive write data bursts separated by a 2-UI gap; gap code=0), tap controller 181 sets the tap-select signals for the lower-latency taps T0 and T1 to reflect the parked state of the data channel during the gap interval and thus, in this example, to select logic-high tap values via multiplexers $195_0$ and $195_1$ (i.e., as represented by the +v inputs at the logic '1' ports of those multiplexers). Because the gap interval is short enough that symbols transmitted more than two unit intervals prior to incoming symbol (Din) continue to appreciably influence the channel state, the higher-latency taps, T2 and T3, are seeded with the final two bits of the preceding (n–1$^{th}$) write data burst and thus with $WD_{n-1}[7]$ and $WD_{n-1}[6]$, respectively. In a 3-UI gap, write-write scenario—a somewhat special case that may be applicable, for example, in systems having DDR (or full-rate) command signaling such that an incoming write command may be sampled on either the rising or falling edge of the system clock—the 3-UI gap interval is accounted for by logic-high seeding of the three lowest-latency taps (T0-T2), and seeding the highest-latency tap (T3) with the final bit of the prior write-data burst ($WD_{n-1}[7]$). A 3-UI gap, read-write scenario—which may also be applicable in a DDR command signaling system, or where read-to-write turnaround yields additional latency between the outgoing read data burst and incoming write data burst—is similar to the 3-UI gap write-write scenario, with the three lowest latency taps being seeded logic high, and the highest latency tap (T3) being seeded with the final bit of the predecessor read data burst ($RD_{n-1}[7]$).

Continuing with the population of lookup table 191 and thus the seeding for different gap/transaction scenarios, because the four DFE taps enable a four-UI channel history compensation, any gap of four UI or larger (regardless of the transaction types) may be compensated by logic-high seeding of all four taps as shown (or logic-low seeding where the data channel is parked at a logic low level during the gap). In a number of embodiments, multiple scenarios may yield gaps of four UI or larger, including module-switched or rank-switched traffic (i.e., successive transactions directed to different memory modules or different memory ranks where the additional time required to switch modules and/or ranks forces the command to the newly selected module/rank to be deferred by one or more unit intervals), and read-to-write traffic events. More generally, the tap-select lookup table permits gap-code-indexed tap-select signal states to be programmed for virtually any gap scenario and corresponding channel behavior that may apply within a given signaling system component. Also, as discussed below, tap coefficients may be selected in accordance with the gap scenario (gap code) and progressively varied during data burst reception, adding additional flexibility and dimension to the DFE response to various gap scenarios and channel behaviors. More generally, the techniques and circuitry shown with respect to FIG. 3 and other embodiments herein may be extended to DFE implementations with any practicable number of taps.

Still referring to FIG. 3, after transitioning to seed-select state S1 and setting the tap-select signals in accordance with the incoming gap code, tap controller 181 transitions (e.g., at the ensuing seed clock edge) to a seed-load state S2 ("SeedLoad"), pulsing the tap load signal (LdTap) during that state to load the pre-selected seed values into the tap memory and thus effect the dynamic seeding operation. In one embodiment, described in greater detail below, the transition to the seed-load state (and thus the pulsing of the tap load signal) is timed to coincide with the data strobe preamble and thus effectuate tap memory seeding during the gap between data bursts. More generally, the seed load operation may be timed as early as possible within the gap to provide sufficient time to complete the tap loading/seeding operation before the first bit of the post-gap write data burst arrives. For example, sCK may be phase advanced relative to the incoming DQS to establish the load-tap pulse as early as possible in the gap. After completing the tap-seeding operation, tap controller 181 reverts to state S0 (e.g., returning to S0 at the ensuing seed clock edge) so that the seed values loaded into tap memory 185 will be bit-shifted (default progression) as the write data burst is received.

FIGS. 4, 5 and 6 are timing diagrams illustrating exemplary 2-UI, 3-UI and 4-UI write-after-write tap memory seeding operations within the burst-mode DFE receiver of FIG. 3. Starting with FIG. 4, data lines (DQ) are parked high for two unit intervals between write data bursts WDa[7:0] and WDb[7:0], thus effecting a 2-UI gap between those data bursts. As shown, the strobe-enable signal (DQSen) goes low following the final DQS falling-edge for the WDa data burst and is then re-asserted after the falling edge 203 of a single-tCK DQS preamble, thus yielding a gated strobe signal, gDQS, that transitions only at the sampling instant of respective data bits conveyed on the DQS line. Because the DQS preamble comes directly after the final strobe falling edge, the DQS line is never parked high as it may be in longer gap scenarios.

Still referring to FIG. 4, buffer controller enables oscillation of the seed clock signal (sCK) a predetermined time following receipt of the write command for write data burst WDb and then asserts the seed-enable signal and gap code (e.g., asserting the gap code and the seed-enable signal at the same sCK edge). As discussed below, the timing of the seed-enable assertion (and enabling/disabling of the seed clock signal) are selected in accordance with the write latency (delay between command receipt and data burst receipt) to effectuate a seeding operation during the data gap that precedes the write data burst. As shown by the tap controller state progression (TCstate), the tap controller responds to the seed-enable signal assertion by transitioning from shift-register state S0 to seed-select state S1 and executing a tap-select lookup in accordance with the '0' valued gap code. Accordingly, at the conclusion of state S1, tap-control value TapSel[3:0] is set to load the tap memory with the tabulated 2UI seed values. At the ensuing falling seed-clock edge, the tap controller transitions to seed-load state S2, pulsing the tap load signal before returning to shift-register state S0. The tap load pulse 205 triggers an asynchronous load operation within tap memory elements 193 and thus a seeding of the tap memory elements with tap data in accordance with the tap control value. In the particular example shown in FIG. 4, the tap memory elements are seeded with the values in the 2-UI lookup-table entry shown in FIG. 3—that is, logic '1' values are loaded into tap memory elements T0 and T1, while residual write data bits a7 and a6 (i.e., the final two bits of the preceding write data burst) are loaded into higher-latency tap memory elements T2 and T3. Thereafter, as gDQS begins transitioning to trigger capture of the incoming write data burst, the seed values propagate sequentially through (and out of) the tap memory elements followed by bits of b0-b7 of the incoming write burst.

In FIG. 5, data lines (DQ) are parked high for three unit intervals between write data bursts WDa[7:0] and WDb[7:0], thus effecting a 3-UI gap between those data bursts. As in FIG. 4, the DQS-enable signal goes low following the final DQS falling-edge (209) for the WDa data burst and is then re-asserted after the falling edge 213 of the single-tCK DQS preamble to yield a gDQS signal that transitions only at the sampling instant of respective data bits conveyed on the DQS line. In this case, because of the extended gap, the DQS signal line is parked high during the unit interval 210 that precedes the 2UI preamble. Note that the strobe signal line and/or data signal lines may be parked at other levels in alternative embodiments (e.g., intermediate signal level between high and low signal levels) and seed values and/or tap coefficients adjusted accordingly to compensate for those different levels. For example, where the data signal lines are parked at an intermediate level, tap coefficients may be dynamically switched (e.g., as discussed below) to enable correspondingly seeded/weighted decision feedback.

Still referring to FIG. 5, the buffer controller enables seed-clock oscillation and raises the seed-enable signal with the timing shown to effect the tap-controller state transitions described in reference to FIG. 4. In this example, the tap controller samples a '1' valued gap-code (3UI gap between successive write data bursts), sets the tap select value accordingly and pulses the tap load signal in the data gap and prior to reception of write data burst WDb. As in the FIG. 4 example, tap load pulse 215 triggers seeding of tap memory elements T0-T3 with tap data in accordance with the tap select value—logic '1' values being loaded into tap memory elements T0-T2, and residual write data bit a7 being loaded into tap memory element T3 (i.e., as in the 3-UI write-write lookup-table entry shown in FIG. 3). After the seed operation is complete, gDQS begins transitioning to trigger capture of the incoming write data burst, shifting the seed values sequentially through (and out of) the tap memory elements followed by bits of b0-b7 of the incoming write burst.

In FIG. 6, data lines (DQ) are parked high for four unit intervals between write data bursts WDa[7:0] and WDb[7:0], thus effecting a 4-UI burst-to-burst gap interval As in FIGS. 4 and 5, the DQS-enable signal goes low following the final DQS falling-edge (219) for the WDa data burst and is then re-asserted after the falling edge 223 of the single-tCK DQS preamble to yield a gDQS signal that transitions only at the sampling instant of respective data bits conveyed on the DQS line. As in FIG. 5, the data gap size permits the DQS signal to be parked high during the interval 220 (in this case a 2UI interval) that precedes the DQS preamble.

Continuing with FIG. 6, the buffer controller enables seed-clock oscillation and raises the seed-enable signal with the timing shown to effect the tap-controller state transitions described above. In this example, the tap controller samples a '3' valued gap-code (≥4UI gap between successive data bursts), sets the tap select value accordingly and pulses the tap load signal just prior to reception of write data burst WDb. As in prior examples, tap load pulse 225 triggers seeding of tap memory elements T0-T3 with tap data in accordance with the tap select value—in this case, logic '1' values being loaded into all the tap memory elements. After the seed operation is complete, gDQS begins transitioning to trigger capture of the incoming write data burst, shifting the logic '1' seed values sequentially through (and out of) the tap memory elements followed by bits of b0-b7 of the incoming write burst.

FIG. 7 illustrates an embodiment of a seed control circuit 271 ("seed controller") that may be implemented within a memory die, data buffer IC or control component to carry out the general functions of the buffer controller of FIG. 3 in the context of the host integrated circuit device. As shown, seed controller 271 receives clock, command, latency data, burst-length and training signals at respective inputs and includes a command-gap (CG) counter 273, seed-enable (SE) timer 275 and control logic 277 to generate seed-clock (sCK), gap code ("GapC") and seed-enable ("SeedEn") outputs. Seed controller 271 additionally includes phase adjust circuitry 276 that evaluates an incoming, predetermined per-rank training code to determine a phase offset between the data strobe and clock timing domains, applying that phase offset to shift the seed-enable clock into the strobe domain. As discussed above in reference to FIGS. 4-6, the seed-enable clock, which may otherwise be viewed as a phase-shifted version of the incoming clock signal (e.g., buffer clock, command clock, etc. depending on host IC), may be enabled only during seeding events and otherwise held at a steady state to conserve power.

Referring to the exemplary operational sequence at 280, control logic 277 enables command-gap counter 273 to count edges of the clock (e.g., buffer clock in the case of a data buffer IC, command clock in the case of a memory IC) until a command is received (affirmative decision at 281). Upon receiving a command, control logic 277 captures the command-gap counter output and resets the counter to begin counting/measuring the next intra-command gap. If the incoming command indicates that data is to be received (i.e., current command is a write command in the case of a memory component or data buffer IC, or a read command in the case of a control component—as determined at 285), control logic 277 determines the expected data gap at 287 based on the command-gap count, burst length and predecessor command. If the data gap is nonzero (affirmative determination at 289), then, at 291, control logic 277 outputs a corresponding gap code (e.g., in unit intervals or as an encoded index value as shown in the "Code" column of FIG. 3 lookup table 191) and loads seed-enable timer 275 with a count-down value (i.e., in accordance with the gap value burst-length and write-latency) and enables seed-clock oscillation, effectively enabling the seed-enable timer to complete a count-down operation (i.e., decrementing the count-down value in response to seed clock edges) before pulsing the seed-enable signal and thus deferring assertion of the seed-enable signal until a time that falls within the data gap interval as shown in FIGS. 4, 5 and 6. After arming/enabling seed-enable counter 275 (or after negative determinations at 285 or 289), control logic 277 records the current command type as the prior-command type (293) in preparation for the next gap value determination and then begins awaiting reception of the next command.

FIGS. 8, 9 and 10 illustrate exemplary gap-value determinations within a memory die or data buffer IC having the seed controller of FIG. 7 and in the context of successive write operations directed to the same memory rank and an 8-UI (4 tCK) burst-length (BL=8). In FIG. 8, write command WRb is received four clock cycles (4 tCK) after the prior write command WRa so that, in the BL=8 example shown, the seed controller determines a zero-valued data gap and thus begins awaiting the next command without arming the seed-enable timer or otherwise enabling assertion of the seed-enable signal. That is, upon detecting the zero-valued data gap, the seed controller refrains from seeding the tap memory elements and thus permits continued bit-by-bit shifting of received write data values through the tap memory elements during the back-to-back write data bursts.

In FIG. 9, write command WRb is received five clock cycles after WRa in the same BL=8 context, so that the seed controller identifies (counts, measures or otherwise determines) a 2-UI data gap and outputs a gap value and arms the seed-enable timer accordingly to enable, for example, the tap memory seeding and the seed-enable pulse timing shown in FIG. 4. In FIG. 10, WRb is received six clock cycles after WRa (again with B=8), so that the seed controller identifies a 4-UI data gap and outputs a gap value/arms the seed-enable timer accordingly to enable, for example, the tap memory seeding and seed-enable timing shown in FIG. 6.

FIGS. 11, 12 and 13 illustrate exemplary gap-value determinations within a control component (e.g., component 101 of FIG. 1) having the seed controller of FIG. 7 and in the context of successive read operations directed to the same memory rank and a 8-UI (4 tCK) burst-length (BL=8). In these examples, the seed controller receives incoming commands from a queued command stream and receives an internal core clock of the memory component shown as "pCK" and which bears generally the same relation to the command stream as the command clock shown in FIGS. 8-10 (i.e., having the same tCK period, though phasing may vary). Thus, in FIG. 11, the seed controller determines that read data bursts are to be received back to back (no gap), and identifies 2-UI and 4-UI gaps within the 5 tCK and 6 tCK command intervals of FIGS. 12 and 13, setting the seed-enable timer and outputting a gap value accordingly in those two cases. Though not specifically shown, intermediate gaps of 3-UI may trigger corresponding seeding operations.

FIG. 14 illustrates an alternate embodiment of a burst DFE receiver 350 that may be deployed within the signaling interface of a control component, memory die or data buffer IC. In the buffer IC example shown, burst DFE receiver 350 includes a buffer controller 173, front-end circuitry 171 and tap memory 185, all of which operate generally as described above in reference to FIG. 3. Instead of the tap controller shown in FIG. 3, however, feedback engine 351 includes a more comprehensive DFE controller 361 that not only manages seeding and progressive shifting operations within the tap memory, but also enables dynamic selection of tap coefficients within coefficient multiplier circuitry 363. In the particular embodiment shown, for example, the DFE controller 361 supplies a multi-bit coefficient select value (the "coefficient selector," CoefSel) and the above-described tap load signal to multiplier circuitry 363 to enable tap coefficients to be variably selected according to different data gap scenarios (gap code) and automatically sequenced during successive bit reception intervals (i.e., "bit times"). Referring to detail view 364 of multiplier circuitry 363, for example, the coefficient selector is supplied to multiplexers $371_0$-$371_3$, each of which corresponds to a respective one of tap multipliers $375_0$-$375_3$ and is coupled to receive a respective array of n by m programmable tap coefficients (where m=5 in this example)-from a configuration register 353. By this arrangement, each of multiplexers $371_0$-$371_3$ outputs a gap-code-selected set of m coefficients, supplying those coefficients to respective sequencing multiplexers $373_0$-$373_3$. The sequencing multiplexers, in turn, output each of the m coefficients one after another to a respective one of multipliers $375_0$-$375_3$ during respective bit reception intervals in response to a gDQS-advanced "coefficient count" (CoefCnt). In the implementation shown, for example, a coefficient counter 377 is reset asynchronously to a starting coefficient count in response to the LdTap pulse and thereafter advances the coefficient count in response to each rising and falling edge of the gated strobe signal (thereby effecting a new set of tap coefficients for each bit time) until a terminal count is reached. By this arrangement, when dynamic tap coefficient selection is enabled within the configuration register 353 (i.e., DCE=1), DFE controller 361 sets the coefficient selection signal and then arms (resets) the coefficient sequencing counter to enable a gap-specific set of tap-multiplier coefficients to be applied in successive bit reception intervals following a data gap and thus achieve more resolute control over the decision feedback.

FIGS. 15, 16 and 17 illustrate exemplary 2-UI, 3-UI and 4-UI write-after-write tap memory seeding and coefficient selection operations within the burst-mode DFE receiver of FIG. 14. While the gap determination and tap memory seeding signals correspond generally to those shown and described in reference to FIGS. 4-6, the DFE controller additionally sequences the tap-coefficient selector ("CoefSel") through a number of coefficients during reception of at least the initial bits of a post-gap data burst. In the 2-UI gap example of FIG. 15, for instance, the DFE controller sets the coefficient selector in accordance with gap code 0 and the gDQS-driven coefficient counter sequences/increments the coefficient count from 0 to N (N=4 in this example) in respective bit reception intervals to apply a progression of pre-programmed tap coefficients (e.g., tap weights that may be viewed as normalized values ranging from 0 to 1). By this arrangement, gap-specific tap weights may be applied during reception of the first N bits of a post-gap write data burst (i.e., where N is the number of tap memory elements) followed by application of a static set of tap weights for the bit reception intervals thereafter—enabling relative weighting (or scaling) of the contributions of individual memory taps to the channel-state estimation and thus according to the gap type that precedes the DFE start-up period. Corresponding dynamic seeding and dynamic coefficient selection operations are carried out in the 3UI and 4UI gap examples of FIGS. 16 and 17, with different gap codes and coefficient selection values in accordance with those different gap scenarios. Alternative coefficient progressions may be implemented in alternative embodiments (e.g., sequencing through a number of coefficients that may extend as far as to the end of the burst), as well as alternative coefficient selection schemes. For example, coefficient selection patterns may be merged for one or more gap codes so that the number of coefficient selector values is different from the number of gap codes (and thus the coefficient selector and gap code may be different values for any given burst scenario). Also, the total size of the coefficient array may be reduced in the likely case that the same static coefficients are applied after DFE startup. Moreover, any one or more of the tap coefficients may be programmed to zero to suppress the contribution of a particular memory tap in predetermined circumstances including, for example and without limitation, where a N-UI burst-to-burst gap is detected and the appropriate seed value for the N-$1^{th}$ tap memory element is unknown to the burst DFE receiver.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, pixel array sizes, signal path widths, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. Timing edges, however depicted or described, may have rising-edge and/or falling-edge sensitivity in alternative embodiments (or be level sensitive), and active high or low logic levels may be reversed from those shown. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "light" as used to apply to radiation is not limited to visible light, and when used to describe sensor function is intended to apply to the wavelength band or bands to which a particular pixel construction (including any corresponding filters) is sensitive. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of operation within an integrated circuit device, the method comprising:
   shifting a first sequence of data bits into storage elements of a shift register during a first sequence of bit-time intervals;
   receiving a memory access command indicating that a second sequence of data bits is to be received within the integrated circuit device via an external data signaling path during a second sequence of bit-time intervals;
   determining, based at least in part on a temporal offset between the memory access command and a preceding memory access command, whether one or more bit-time intervals will transpire between the first and second sequences of bit-time intervals;
   overwriting contents of the shift-register storage elements with a predetermined set of seed bits if one or more bit-time intervals will transpire between the first and second sequences of bit-time intervals;
   generating a plurality of equalization signals based, at least in part, on contents of the shift-register storage elements; and
   adjusting respective signal levels representative of one or more bits of the second sequence of data bits based on the plurality of equalization signals.

2. The method of claim 1 wherein the preceding memory access command indicates that the first sequence of data bits was received via the external data signaling path during the first sequence of bit-time intervals and wherein shifting the first sequence of data bits into the shift-register storage elements comprises receiving the first sequence of data bits via the external data signaling path.

3. The method of claim 1 wherein receiving the memory access command indicating that the second sequence of data bits is to be received via the external data signaling path comprises receiving a memory write command via an external command signaling path, the memory write command additionally indicating that the second sequence of data bits comprises write data bits to be stored in a core storage array of the integrated circuit device.

4. The method of claim 1 wherein receiving the memory access command indicating that the second sequence of data bits is to be received via the external data signaling path comprises receiving a memory read command from a command queue of the integrated circuit device, the memory read command additionally indicating that the second sequence of data bits comprises read data bits transmitted via the external data signaling path by an integrated-circuit memory component.

5. The method of claim 1 wherein determining, based at least in part on the temporal offset between the memory access command and the preceding memory access command, whether one or more bit-time intervals will transpire between the first and second sequences of bit-time intervals comprises measuring the temporal offset between the memory access command and the preceding memory access command.

6. The method of claim 5 wherein measuring the temporal offset between the memory access command and the preceding memory access command comprises counting transitions of a timing signal between receipt of the memory access command and the preceding memory access command.

7. The method of claim 1 wherein determining, based at least in part on the temporal offset between the memory access command and the preceding memory access command, whether one or more bit-time intervals will transpire between the first and second sequences of time intervals comprises determining whether one or more bit-time intervals will transpire between the first and second sequences of bit-time intervals based, at least in part, on the temporal offset, burst length information conveyed in the preceding memory access command, and a nominal latency between receipt of the memory access command and receipt of the second sequence of data bits.

8. The method of claim 1 further comprising receiving a data strobe signal via an external strobe signal line and shifting the second sequence of bits into the shift-register storage elements in response to transitions of the data strobe signal.

9. The method of claim 8 wherein overwriting contents of the shift-register storage elements with the predetermined set of seed bits if one or more bit-time intervals will transpire between the first and second sequences of bits comprises loading the seed bits into the shift-register storage elements during the interval between first and second bit sequences.

10. The method of claim 1 wherein generating the plurality of equalization signals based, at least in part, on contents of the shift-register storage elements comprises multiplying individual bits stored within the shift-register storage elements with respective coefficient values stored within a programmable register.

11. The method of claim 10 further comprising switchably selecting each of a plurality of different coefficient values to be multiplied with contents of the shift-register storage elements in respective bit-time intervals.

12. An integrated circuit device comprising:
receiver circuitry having storage elements and circuitry to shift a first sequence of data bits into the storage elements during a first sequence of bit-time intervals;
control circuitry to:
receive a memory access command indicating that a second sequence of data bits is to be received via an external data signaling path during a second sequence of bit-time intervals;
determine, based at least in part on a temporal offset between the memory access command and a preceding memory access command, whether one or more bit-time intervals will transpire between the first and second sequences of bit-time intervals; and
overwrite contents of the storage elements with a predetermined set of seed bits if one or more bit-time intervals will transpire between the first and second sequences of bit-time intervals; and
equalizer circuitry to generate a plurality of equalization signals based, at least in part, on contents of the storage elements and to adjust respective signal levels representative of one or more bits of the second sequence of data bits based on the plurality of equalization signals.

13. The integrated circuit device of claim 12 wherein the preceding memory access command indicates that the first sequence of data bits was received via the external data signaling path during the first sequence of bit-time intervals and the receiver circuitry to shift the first sequence of data bits into the storage elements comprises circuitry to receive the first sequence of data bits via the external data signaling path.

14. The integrated circuit device of claim 12 further comprising a core storage array and wherein the control circuitry to receive the memory access command indicating that the second sequence of data bits is to be received via the external data signaling path comprises circuitry to receive a memory write command via an external command signaling path, the memory write command additionally indicating that the second sequence of data bits comprises write data bits to be stored in the core storage array.

15. The integrated circuit device of claim 12 further comprising a command queue to store commands to be output from the integrated circuit device to one or more external memory components, and wherein the control circuitry to receive the memory access command indicating that the second sequence of data bits is to be received via the external data signaling path comprises circuitry to receive a memory read command from the command queue, the memory read command additionally indicating that the second sequence of data bits comprises read data bits transmitted via the external data signaling path by the one or more external memory components.

16. The integrated circuit device of claim 12 wherein the control circuitry to determine, based at least in part on the temporal offset between the memory access command and the preceding memory access command, whether one or more bit-time intervals will transpire between the first and second sequences of bit-time intervals comprises circuitry to measure the temporal offset between the memory access command and the preceding memory access command.

17. The integrated circuit device of claim 16 wherein the circuitry to measure the temporal offset between the memory access command and the preceding memory access command comprises counter circuitry to count transitions of a timing signal between receipt of the memory access command and the preceding memory access command.

18. The integrated circuit device of claim 12 wherein the control circuitry to determine, based at least in part on the temporal offset between the memory access command and the preceding memory access command, whether one or more bit-time intervals will transpire between the first and second sequences of bit-time intervals comprises circuitry to determine whether one or more bit-time intervals will transpire between the first and second sequences of bit-time intervals based, at least in part, on the temporal offset, burst information conveyed in the preceding memory access command, and a nominal latency between receipt of the memory access command and receipt of the second sequence of data bits.

19. The integrated circuit device of claim 12 wherein the receiver circuitry comprises a strobe receiver circuit to receive a data strobe signal via an external strobe signal line and wherein the circuitry to shift the first sequence of data bits into the storage elements comprises circuitry to shift the second sequence of bits into the storage elements in response to transitions of the data strobe signal.

20. The integrated circuit device of claim 19 wherein the control circuitry to overwrite contents of the storage elements with the predetermined set of seed bits if one or more bit-time intervals will transpire between the first and second sequences of bits comprises circuitry to load the seed bits into the storage elements during the interval between first and second bit sequences.

21. The integrated circuit device of claim 12 further comprising a programmable register, and wherein the equalizer circuitry to generate the plurality of equalization signals based, at least in part, on contents of the storage elements comprises multiplier circuitry to multiply individual bits stored within the storage elements with respective coefficient values stored within the programmable register.

22. The integrated circuit device of claim 21 wherein the equalizer circuitry comprising multiplexer circuitry to switchably select each of a plurality of different coefficient values to be multiplied with contents of the storage elements in respective bit-time intervals.

23. An integrated circuit device comprising:
a shift register having storage elements;
means for shifting a first sequence of data bits into the storage elements of the shift register during a first sequence of bit-time intervals;
means for receiving a memory access command indicating that a second sequence of data bits is to be received within the integrated circuit device via an external data signaling path during a second sequence of bit-time intervals;
means for determining, based at least in part on a temporal offset between the memory access command and a preceding memory access command, whether one or more bit-time intervals will transpire between the first and second sequences of bit-time intervals; and
means for overwriting contents of the shift-register storage elements with a predetermined set of seed bits if one or more bit-time intervals will transpire between the first and second sequences of bit-time intervals;
means for generating a plurality of equalization signals based, at least in part, on contents of the shift-register storage elements; and
means for adjusting respective signal levels representative of one or more bits of the second sequence of data bits based on the plurality of equalization signals.

* * * * *